US009350377B1

(12) United States Patent
Fetche et al.

(10) Patent No.: US 9,350,377 B1
(45) Date of Patent: May 24, 2016

(54) DIGITAL-TO-ANALOG CONVERTER WITH LOCAL INTERLEAVING AND RESAMPLING

(71) Applicant: Rohde & Schwarz GmbH & Co. KG, Munich (DE)

(72) Inventors: Radu Fetche, Beaverton, OR (US); Faye Jung, Portland, OR (US); Mark Lehne, Hillsboro, OR (US)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/827,598

(22) Filed: Aug. 17, 2015

Related U.S. Application Data (60) Provisional application No. 62/189,556, filed on Jul. 7, 2015.

(51) Int. Cl.
 *H03M 1/66* (2006.01)
 *H03M 1/76* (2006.01)
 *H03M 1/70* (2006.01)

(52) U.S. Cl.
 CPC .............. *H03M 1/76* (2013.01); *H03M 1/662* (2013.01); *H03M 1/70* (2013.01)

(58) Field of Classification Search
 CPC .......... H03M 1/76; H03M 1/70; H03M 1/662
 USPC ................................................ 341/144, 136
 See application file for complete search history.

(56) References Cited

U.S. PATENT DOCUMENTS

| | | | |
|---|---|---|---|
| 6,476,748 B1 | 11/2002 | Galton | |
| 6,778,116 B1 * | 8/2004 | Skones | H03M 3/502 341/144 |
| 6,812,878 B1 | 11/2004 | Jewett et al. | |
| 6,888,485 B2 * | 5/2005 | Splett | H03M 3/502 341/127 |
| 6,897,799 B1 * | 5/2005 | Harberts | H03K 17/04113 341/136 |
| 6,977,602 B1 | 12/2005 | Ostrem et al. | |
| 7,002,499 B2 * | 2/2006 | Kaplan | H03K 3/2885 341/119 |
| 7,042,379 B2 * | 5/2006 | Choe | H03M 1/0881 341/144 |
| 7,098,829 B2 * | 8/2006 | Westra | H03K 17/693 341/136 |
| 8,742,965 B1 | 6/2014 | Cosand | |
| 8,912,937 B2 | 12/2014 | Gomez et al. | |
| 2005/0258992 A1 | 11/2005 | Fontaine et al. | |

* cited by examiner

*Primary Examiner* — Khai M Nguyen
(74) *Attorney, Agent, or Firm* — Lee & Hayes, PLLC

(57) ABSTRACT

The invention relates to a digital to analog converter and a method for a digital to analog conversion, wherein the digital to analog converter comprises at least one analog output cell configured to selectively generate a partial analog signal in response to a partial digital input signal. The analog output cell comprises an analog output switching unit that comprises a current source connected in series to a first node of a retiming switch and a first switch element as well as a second switching element, both connected with respect to first nodes in parallel to a second node of the retiming switch and a switching logic configured to regulate the transmission of said partial analog signal to an analog cell output.

14 Claims, 7 Drawing Sheets

DIGITAL-TO-ANALOG CONVERTER WITH LOCAL INTERLEAVING AND RESAMPLING

TECHNICAL FIELD OF THE INVENTION

The invention relates to digital-to-analog converters, short DAC, for converting a digital input signal into an analog signal. The invention further relates to a method for a digital-to-analog conversion.

Nowadays, high speed, high dynamic range, DACs are key to radio frequency, short RF, signal generation for wireless and wireline networks, digital terrestrial television, cellular communication, software defined radio, radar as well as test- and measurement-applications.

The use of high speed, high dynamic range DACs allows for direct digital synthesis without intermediate analog circuit functions, such as mixers, resulting in fewer mixing products, fewer spurious signals and reduced signal distortion. These DACs enable new signal synthesis applications in test equipments, especially when RF signals require accurate harmonic generation up to higher orders, such as fifth harmonic and beyond.

BACKGROUND OF THE INVENTION

There are several DAC architectures. The suitability of a DAC for a particular application is determined by following main parameters: physical size, power consumption, resolution, speed, accuracy and cost. Due to the complexity and the need for precisely matched components, DACs are mostly implemented as integrated circuits, short IC. Thus, DACs are a type of circuit used to interface digital systems, such as ASICs and FPGAs to analog circuits, frequently for the purpose of generating arbitrary waveforms or for digitally synthesizing a variety of signals.

A DAC converts an abstract finite-precision number, preferably a fixed-point binary number, into a physical quantity, preferably a voltage or a current. In particular, DACs are often used to convert finite-precision time series data to a continually varying physical signal.

There are known different techniques to convert a digital signal into an analog signal, e.g. a pulse-width modulator or oversampling DACs such as a delta-sigma DAC or R-2R ladder DACs, which are binary-weighted DACs that uses a repeating cascaded structure of resistor values R and 2R or successive approximation cyclic DACs, which successively construct the output during each cycle or thermometer-coded DACs and so on.

The technique, this invention refers to is a segmented current mode DAC, which contains unary coded electrical components for each digital level of the most significant bits, short MSB, and binary weighted electrical components for each least significant bit, short LSB, of the DAC connected to a summing unit. These precise voltages or currents sum to the correct output value. This is one of the fastest conversion methods but suffers from poor accuracy, because of the high precision required for each individual voltage or current and the needed time-alignment of the individual parallel components. Normally, those DACs have 8 or more analog output cells. Those binary weighted LSB DACs are for instance built as switched resistor DACs that contain a parallel resistor network. Alternatively, those binary weighted DACs are switched capacitor DACs that contain a parallel capacitor network.

The method described herein is based on a segmented current mode approach consisting of unary weighted MSB DAC and binary weighted LSB DAC that uses switched current sources, from which different current sources are selected based on the digital input. Such DACs are for instance known from US 2005/0258992 A1, U.S. Pat. No. 8,912,937 B2, U.S. Pat. No. 8,742,965 B1, U.S. Pat. No. 6,977,602 B1 and U.S. Pat. No. 6,476,748 B1.

These DACs receive digital inputs and produce analog outputs that are analog equivalences of the digital inputs in the form of currents or voltages. The DAC includes an encoder, a number of analog output cells and a summing circuit. An activated analog output cell generates a partial analog signal. The partial analog signals are then combined by a summing unit to produce an analog output, which is an analog representation of the digital input.

As per the Nyquist-Shannon sampling theorem, a DAC can reconstruct the original signal from the sampled data provided that its bandwidth meets certain requirements. Digital sampling introduces quantization error that manifests as low-level noise added to the reconstructed signal.

The DACs are typically made of a digital processing circuitry which drives a number of identical or matched analog unit circuits whose electrical outputs are combined in the summing unit to make the synthesized analog output signal. The arrangement of the identical or matched analog unit circuits is a combination of binary weighted and unary weighted analog circuit elements hereinafter referred to as analog output cells, whose properties are optimized for the output signal rate, output signal power and dynamic range.

For those DACs with sampling rates of tens of gigahertz, time glitches between the equivalent analog output cells within the DAC becomes a critical challenge to the DAC design. Those time glitches are mainly caused by mistiming of the partial analog signals at the output of the DAC. These glitches do not affect the final, settled value of the analog output signal for each digital input and appear only during the transition from one digital input to the next. Therefore, the time glitches corrupt the spectral content of the output signal, which presents an important concern for high-speed applications since the glitches can be misinterpreted as analog outputs.

In U.S. Pat. No. 6,812,878 B1, an analog output cell is shown comprising a current cell in series connection to one switching transistor and further in series connection to two clock transistors that provide the output signal of the cell. The clock transistors are driven by dedicated clock signals and thus are used as retiming latches to minimize the impact of time glitches in the final stage of each analog output switching unit of the appropriate analog output cell.

A drawback of such a structured analog output cell is that the output signal of the analog output cell is a return-to-zero signal, short RZ signal. This structure leads to the disadvantage that the effective RF output power is effectively cut in half, since the signal output is set to zero for half of the time. Additionally, no mixed-mode of the analog output cell can be obtained since the clock transistors are arranged at the analog output cell. Another drawback of such a structure is the fact that the data switching occurs before the retiming switching. This requires an active retiming switch while the data are settled. This leads to additional distortion on the signaling path.

Thus, there is a need to provide a DAC that overcomes the above-identified problems. Thus, a DAC is needed that comprises tighter phase noise performance and can operate at high speed and high dynamic ranges. The DAC should be used for RF power signals and no power wasting due to RZ signal outputs should be applied. The DAC should be less distorted. The DAC should operate with a high number of analog output cells.

SUMMARY OF THE INVENTION

The above-identified problems are solved by the independent patent claims of the invention. Respective dependent claims describe advantageous embodiments of the invention.

According to one aspect of the invention a DAC comprises at least one analog output cell that is configured to selectively generate a partial analog signal in response to a digital input signal. The analog output cell comprises an analog output switching unit that comprises a current source connected in series to a first node of a retiming switch. The analog output switching unit further comprises a first switching element as well as a second switching element, both connected with their respective first nodes in parallel to a second node of the retiming switch. The analog output switching unit of the analog output cell further comprises a switching logic configured to regulate a transmission of said partial analog signal to an analog cell output.

The retiming switch in the analog output switching unit enables a retiming of the circuit's input signal to a clean common clock, which virtually eliminates timing glitches from previous analog circuitry within the DAC signal path. The retiming clock is the only clock contributing to phase noise of the DAC.

The use of the retiming switch advantageously leads to a RZ signaling pattern on the partial analog signal at the analog cell's output. This RZ signaling has the benefit of eliminating inter-symbol-interference which reduces code-dependent distortion from reaching the DAC output signal.

Since the inventive topology reduces requirements on the data settling by arranging the retiming switch before both of the data switching elements, the data are settled while the retiming switch is deactivated. This further reduces distortion.

Thus, the above identified drawbacks of known DACs are fully compensated.

In a preferred embodiment, a second node of the first switching element is connected to a second node of the second switching element. This leads to a combination of the outputs of the switching elements arranged in the analog output switching unit. Thus, two distinct sub-DACs are locally interleaved to combine two RZ-signals obtained from the retiming switch. Thus, the RF output signal is advantageously recirculated in the analog output cell instead of wasting half of the RF power by switching it to ground potential. This structure preferably provides local interleaving of the partial signals from the first switching element and the second switching element.

The use of both switching elements in the described manner cancels one pair of the obtained RZ-signal edges which leads to a non-return-to-zero, short NRZ signal, at the output. RZ signaling on its own has the effect of effectively cutting the output power in half, since the signal output is set to zero for half of the time. Thus, the first switching element and the second switching element are cross-connected at their outputs in the analog output switching unit in order to combine the two distinct RZ-signals to one NRZ-signal. Thus, the output signal is not set to zero current for half of time. Thus, no RF-power is wasted. Thus, using the retiming switch and the both switching elements has a synergetic effect of elimination of inter-symbol-interference to reduce phase noise and further elimination of the drawback of RZ-signals that one half output power is wasted.

This inventive cell's structure provides a local interleaving method of two sub-DACs instead of a global interleaving of two RZ-signaling sub-DACs. This advantageously leads to a better matching of the signal combination within a single cell's circuit. Additionally, less power consumption is achieved because local parasitic capacitances are smaller than external parasitic capacitances. Furthermore, no loss of half of the signal energy is obtained like in the case of globally abutting two RZ-signals. Additionally, it has the advantage of retaining the data reset to zero during inactive clock phases as in typical RZ-signaling schemes.

The inventive local interleaving of the two half rate RZ-signals at the data inputs allows higher frequencies, combining slower rate analog cells and reduces design constraints as only the final analog output switching unit is required to operate at the full data rate.

In a preferred embodiment, the retiming switch is driven by a retiming clock signal different to the data clock signal. The other clock signals may exist in the analog output cell and elsewhere in the DAC to drive the digital processing circuitry. The effect of the retiming switch driven by a retiming clock signal at the analog output switching unit is that the final clock can be independent from the other existing clock signals and the retiming clock is the only clock contributing to phase noise of the DAC. Thus, time glitches between the different analog output cells are removed and a clean common clock is applied. As a result, an easy summing of the partial analog signals in the DAC is possible. Thus, the retiming clock only drives the load of the retiming switch enabling the retiming clock to be optimized for low phase noise and sharp transition edges while reducing power consumption of the clock generation circuitry.

Since the retiming clock for the retiming switch is different to the other clocks used in the DAC, a split of the clock load into two separate clock loads is derived. This reduces phase noise and power consumption on the final critical clock driver. The generation of a low phase noise clock is simplified when the load is driven with reduced capacitances. Reducing the size of load, the clock driver enables a design with sharper clocking edges and reduces problems related to thermal gradients, and enables better DAC phase noise.

In a preferred embodiment, the switching logic provides a first clock synchronized digital data signal and a second synchronized digital data signal to the analog output switching unit to regulate the transmission of said partial analog signal. The first clock synchronized digital data signal and the second synchronized digital data signal are synchronized by a clock signal. Thus, long periods are avoided in which the output does not have switching activities. This structure preferably regulates transmission and reduces the impact of duty cycle distortion upon the partial analog signal from the clock since both first and second synchronized digital data signals are timed by the same clock.

In a preferred embodiment, the first clock synchronized digital data signal is phase-inverted to the second clock synchronized digital data signal by means of a phase inverter. If the phase inversion is enabled, the generated RZ-signals are combined to generate a so called mixed-mode operation. In such a mixed-mode operation of the output cell, extended analog signal generation over multiple Nyquist bands is possible. This leads to significantly more RF output power when using the DAC to alias into the second and third Nyquist frequency bands.

Preferably, the phase inverter is enabled by a mode selection signal. Thus, the DACs analog output cell can be driven in the NRZ-mode or in the mixed-mode in dependence on the mode selection signal. Thus, the DAC can be used for different RF power applications. This structure preferably enables DAC signal generation in multiple Nyquist bands through mode selection.

In a preferred embodiment, the analog output cell is built to receive and process complementary signals. This leads to a doubling of all lines and components of the DAC's output cell but reduces a memory effect in between a clock cycle. This leads to higher accuracy and faster switching of the DAC. With this preferred structure two RZ signals are locally combined for better matching, less power consumption and reduced parasitics compared to combining signals outside of the analog output cell.

In a preferred embodiment, the analog output switching unit further comprises a transistor's output cascade. This cascade is used to drive the partial analog signal to the analog cells output in combination with the current source.

Preferably, the output cascade is self-biased. This reduces the signaling efforts of the analog output switching unit.

In a preferred embodiment, the retiming switch is driven by a retiming clock signal that is continuously switched independent on the digital input signal. This provides a continuous switching activity independent of data patterns. Because the clock is toggled back and forth, there are never long periods where the output does not have switching activity. Thus, distortion related to switching is moved to a clock harmonic instead of a data related harmonic.

Preferably the analog cell output is connected to a summing unit arranged downstream to the analog output cell.

Preferably, the retiming signal to switch the retimer switch is alternating between a positive voltage value and a negative voltage value. This allows a resampling without a phase shift. Thus, higher Nyquist bands can be operated.

Preferably, a negligible distortion due to clock duty cycle variations is provided. The combination of the two RZ signals in a DAC cancels one pair of edges and removes duty cycle problems known to be associated with prior art DACs.

Preferably, a continuous switching activity, independent of data patterns is provided. Because the clock is toggling back and forth between sides of the circuit, there are never long periods where the output does not have switching activity. Thus distortion related to switching is moved to a clock harmonic instead of a data correlated harmonic.

Preferably, a means of interleaving two half rate sub-DAC codes at the data inputs are provided. At higher frequencies, combining slower rate input sub-DACs reduces design constraints as only the final analog switch is required to operate at the full data rate.

Preferably, a topology that enables final retiming in the analog output switch circuit is provided. Retiming in the final analog circuit gives the best possible phase noise performance, compare to all other possible DAC topologies.

Preferably, the complementary signals provide continuous switching activity, independent of the input data patterns at the combined node because each complimentary signal is reset-to-zero during the inactive clock phase as typical to RZ DACs.

According to another aspect of the invention, a digital-to-analog converter that comprises a plurality of analog output cells according to the previously described manner is provided herewith. Each analog output cell is configured to selectively generate a partial analog signal in response to a partial digital input signal, wherein the analog output signals are equivalent to each other and wherein each analog output cell's output is provided to a summing unit, wherein said summing unit is configured to combine each partial analog signal to produce the analog output.

Thus, an encoder of the DAC is used that operates to translate N binary data bits of a received digital input into M encoded signals where N and M are integers. The encoder is connected to N input lines to receive the N binary data bits. The encoder is also connected to M control lines which are individually connected to the analog output cells. The M encoded signals are drive signals that are used to selectively activate the analog output cells in accordance with the value in the digital input so that an equivalent analog output can be produced using the analog signals generated by the activated analog output cell. The upper M-N control lines are unary coded for the MSB DACs while the remaining control lines are binary coded for the LSB DACs. Each encoded signal is either an enable signal to activate a respective analog output cell or is a disable signal to deactivate an analog output cell.

Preferably, all partial analog signals are combined simultaneously due to the same retiming clock provided to all analog output cells. This leads to a minimization of the impact of time glitches since a retiming switch is used in all analog output cells that are driven by one retiming clock signal. Thus, a clean common clock is achieved and no additional and complex time alignment is necessary in the DAC.

Preferably the partial analog output signals are non return-to-zero signals and are binary scaled.

According to a further aspect of the invention, a digital-to-analog conversion method is provided. The conversion method comprises the method steps of: receiving a digital input; generating equivalent partial analog signals in response to said digital input with an analog output cell as previously described, wherein said equivalent partial analog signals are equivalent to each other; regulating transmission of said equivalent partial analog signals; and receiving and combining said equivalent partial analog signals to produce an analog output, said analog output being an analog representation of said digital input.

BRIEF DESCRIPTION OF THE DRAWINGS

In the following, exemplary embodiments of the invention are described with reference to the drawings. Those exemplary embodiments do not limit the scope of the invention. The same reference signs in different drawings indicate the same elements or at least the same functions unless otherwise stated.

DETAILED DESCRIPTION OF THE PREFERRED EMBODIMENTS

Figure 1:
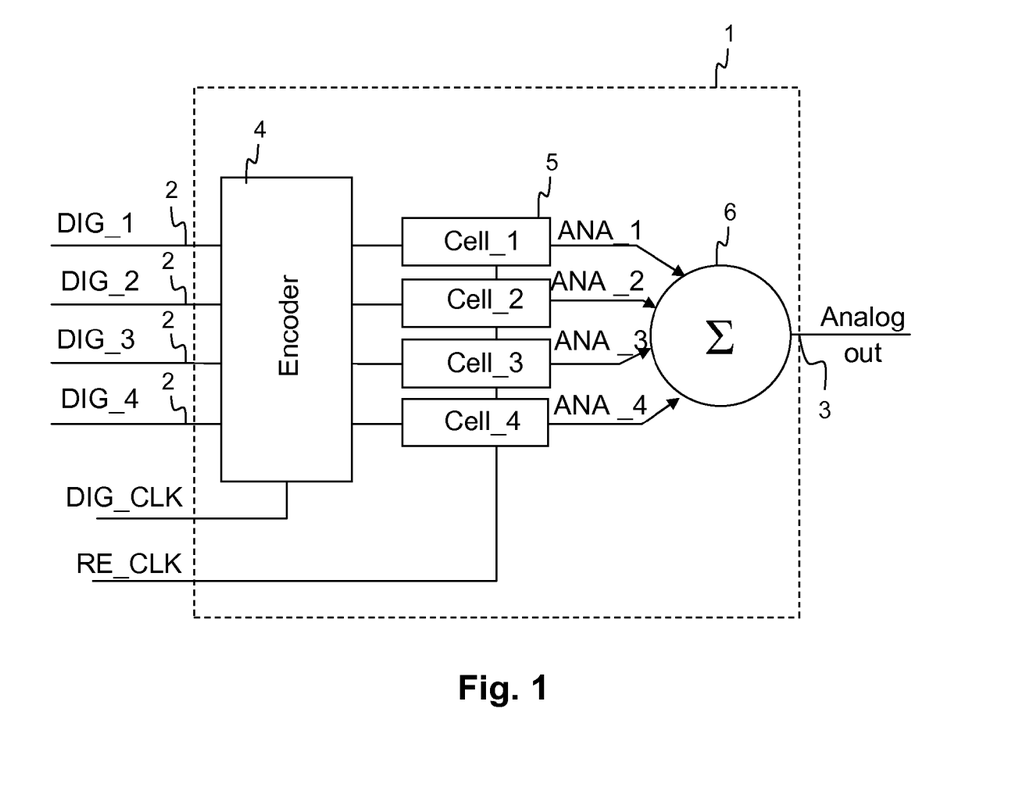
FIG. 1 shows a first exemplary embodiment of a DAC according to the invention.

FIG. 1 shows a first exemplary embodiment of a DAC_1 according to the invention. The DAC_1 comprises a plurality of digital input ports 2. At the digital input ports 2, a plurality of digital input signals is applied. For reasons of simplicity, only four digital input signals DIG_1, DIG_2, DIG_3 and DIG_4 are shown. Each of the digital input signals DIG_1, DIG_2, DIG_3 und DIG_4 are binary rated and provided to an encoder unit 4. Downstream to the encoder unit 4 four analog output cells 5 are arranged to selectively generate partial analog signals ANA_1, ANA_2, ANA_3 and Ana_4 in response to the digital input signals DIG_1, DIG_2, DIG_3 and DIG_4. The analog output signals ANA_1, ANA_2, ANA_3 and Ana_4 are provided to a summing unit 6. In the summing unit 6 the partial analog signal ANA_1, ANA_2, ANA_3 and ANA_4 are summed to obtain the analog output signal analog_out at the analog output port 3 of the DAC_1.

The encoder unit 4 of the DAC_1 operates to translate the four binary data bits DIG_1, DIG_2, DIG_3 und DIG_4 into four encoded signals. The encoder unit 4 is connected to four dedicated analog output cells 5 to transmit the four encoded signals from the encoder unit 4 to the analog output cells 5 through dedicated signal lines. The four encoded signals are drive signals that are used to selectively activate the analog output cells 5 in accordance with the value of the digital input so that an equivalent analog output can be produces using the analog signals generated by the activate analog output cells 5.

Each encoded signals is either an enable signal to activate an analog output cell or is a disable signal to deactivate an analog output cell 5. The encoder unit 4 may be any encoder that can be used in a DAC_1 to translate binary data bits into encoded signals.

The analog output cells 5 of the DAC_1 are operated to generate one or more partial analog output signals ANA_1, ANA_2, ANA_3 and Ana_4 when the analog output cells 5 are selectively activated by the encoded signals by the encoder unit 4. The partial analog output signals ANA_1, ANA_2, ANA_3 and Ana_4 generated by the specific analog output cells 5 are subsequently combined to produce the analog output analog_out at the analog output port 3 of the DAC_1. The analog output cells 5 may be configured to generate the analog signals in the form of currents or voltages. Depending on the encoded signal derived from the encoder 4, the connected analog output cell 5 is activated so that a partial analog signal ANA_1, ANA_2, ANA_3 or Ana_4 is generated, or deactivated so that no partial analog signal ANA_1, ANA_2, ANA_3 or Ana_4 is generated. In the exemplary embodiment according to FIG. 1, the analog output cells 5 are identical and thus each analog output cell 5 generates the same analog signal, e.g. the same current when activated by an enable encoded signal. Alternatively embodiments, where the analog output cells 5 are built to provide different partial analog output signals are not excluded from the inventive concept.

Figure 2:
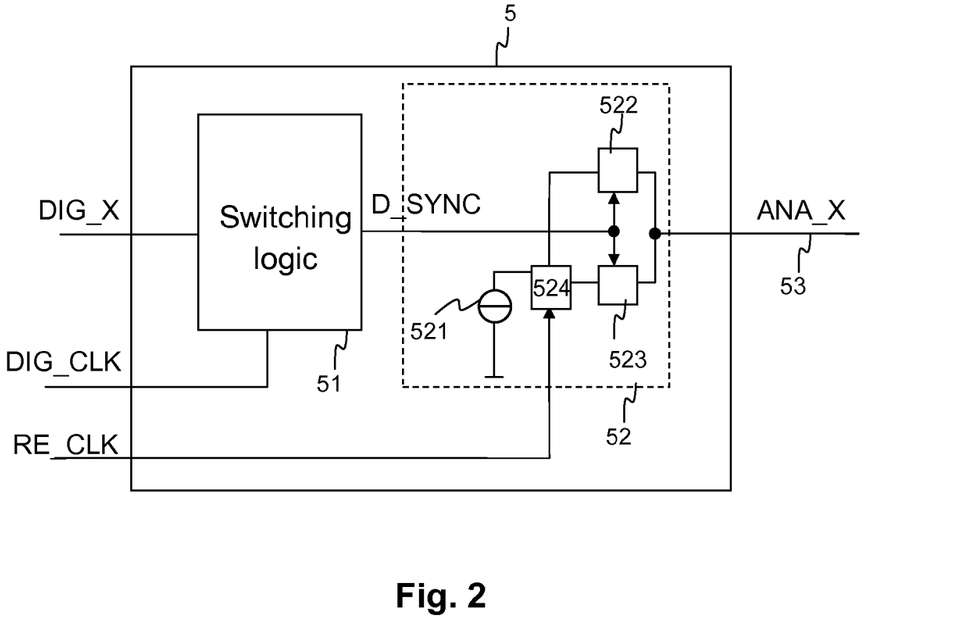
FIG. 2 shows a first exemplary embodiment of an analog output cell contained in a DAC according to the invention.

In FIG. 2, a first exemplary embodiment of an analog output cell 5 used in an inventive DAC_1 is shown in greater details. The analog output cell 5 comprises a switching logic 51 and an analog output switching unit 52 that are connected in series. A digital input signal DIG_X, which is one specific encoded signal derived from the encoder unit 4 is provided to the analog output cell 5 and is synchronized with a digital clock signal DIG_CLK in the switching logic 51. Thus, a first clock synchronized digital data signal D_SYNC is obtained at the output of the switching logic 51 and is provided to the analog output switching unit 52. At the output 53 of the analog output switching unit 52, a partial analog output signal ANA_X can be obtained.

In FIG. 2, the analog output switching unit 52 is shown in greater details. Therein, a current source 521 is connected in series to a retiming switch 524. A first switching element 522 and a second switching element 523 are connected with a first node to the retiming switch 524. The second node of the first switching element 522 is connected to the analog cell output 53. The second node of the second switching element 523 is connected to the analog cell output 53. The retiming switch 524 is driven by a retiming clock signal RE_CLK. The first clock synchronized digital data signal D_SYNC is used to enable the first switching element 522 and the second switching element 523.

Using an analog output switching unit 52 as shown in FIG. 2, the output signals D_OUT, DD_OUT from the switching elements 522, 523 are RZ-signals. Both RZ-signals are combined in that two distinct RZ sub-DACs are interleaved in the analog output switching unit 5. This local interleaving leads to a NRZ signal at the analog cell output 53. This is achieved with crossed outputs 526 of the switching elements 522, 523. The crossed outputs cause a re-circulating of RF power instead of wasting half of the power by switching the output to ground potential.

Thus, the output power is not reduced by half which would be the case if a RZ-signal would be provided as analog output signal analog_out at the analog cell output 53. Additionally, the inter-symbol interference is reduced, thus the phase noise is reduced.

A better matching of the sub_DACs is achieved by connecting the two switching elements 522, 523 in parallel. This allows less power consumption than combining the sub_DACs externally, because local parasitic capacitances are smaller than external parasitic capacitances. No loss of half of the signal energy is obtained which would be the nature of an RZ signal output. The retiming switch 524 provides a minimization of the impact of time glitches which would be the case if the digital clock signal DIG_CLK would be used as a switching clock.

Figure 3:
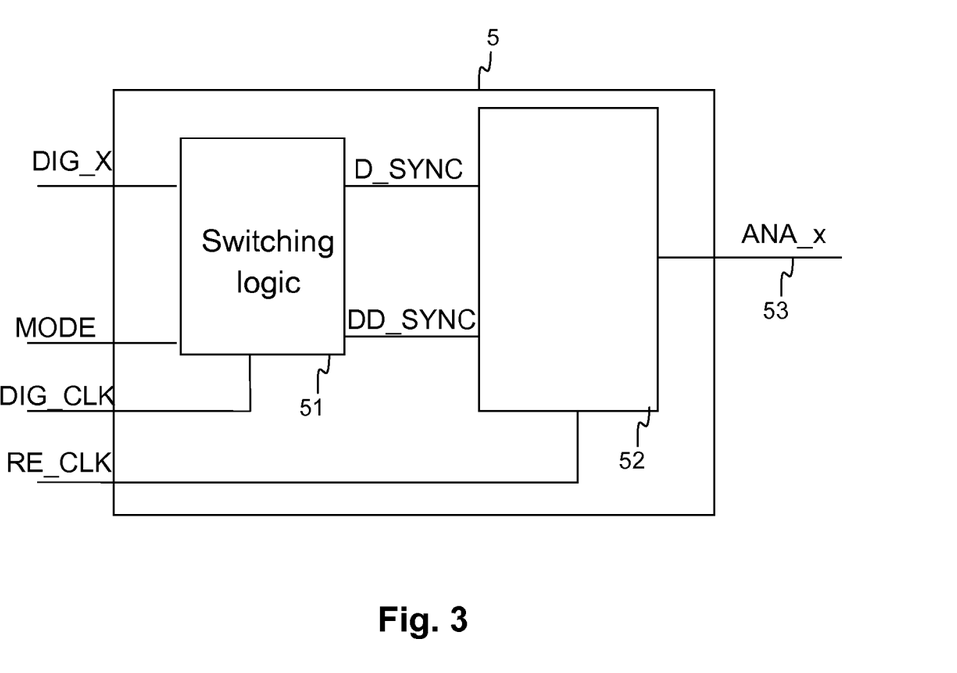
FIG. 3 shows a second exemplary embodiment of an analog output cell contained in a DAC according to the invention.

In FIG. 3, a second exemplar embodiment of an analog output cell 5 is shown. Therein the switching logic 51 comprises a second input on which a MODE signal is applied. This MODE signal is used to select the operating mode of the analog output cell 5, which is either NRZ-mode or a mixed-mode operation. The switching logic 51 provides a first clock synchronized digital data signal D_SYNC to the analog output switching unit 52. Furthermore, the switching logic 51 provides a second clock synchronized digital data signal DD_SYNC to the analog output switching unit 52. The mode select signal MODE is used to switch between a mixed-mode or a NRZ mode of the analog output cell 5. The mixed-mode is obtained by inverting the phase between the first clock synchronized data signal D_SYNC and the second clock synchronized digital data signal DD_SYNC. Without the phase inversion, the NRZ-mode is operated in the analog output cell 5.

The inventive topology is used to enable both, NRZ-mode and mixed-mode operation and thus extend an analog signals generation over multiple Nyquist bands. The mixed-mode output has the advantage of having significantly more RF output power when using the DAC_1 to alias into second and third Nyquist frequency bands.

Figure 4:
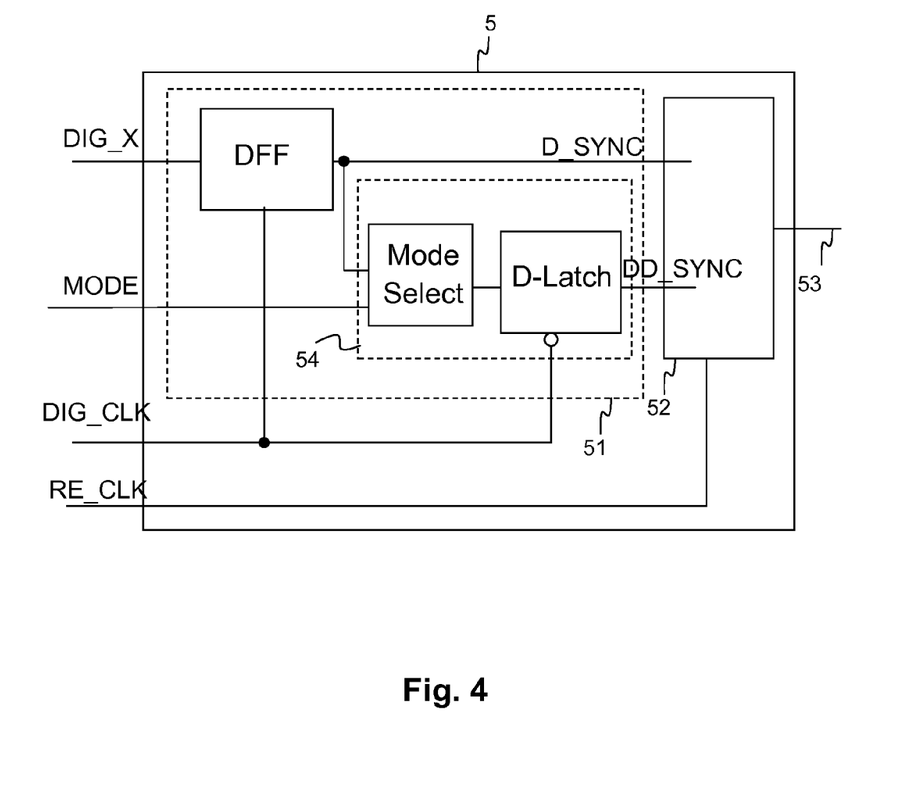
FIG. 4 shows a third exemplary embodiment of an analog output cell contained in a DAC according to the invention.

Referring to FIG. 4, a third exemplary embodiment of an analog output cell 5 is shown. Therein, the switching logic 51 is shown in greater details. The switching logic comprises a DFF and a phase inverter 54. The phase inverter 54 comprises a mode select switch. The mode-select switch obtains the output of the DFF and the mode select signal MODE at its inputs. At the output of the mode select switch, a D-latch is arranged. The output of the D-latch provides the second clock synchronized digital data signal DD_SYNC to the analog output switching unit 52. The DFF and the D-latch obtain a digital clock signal DIG_CLK in order to provide the first clock synchronized digital data signal D_SYNC and the second clock synchronized digital data signal DD_SYNC to the analog output switching unit 52.

Figure 5:
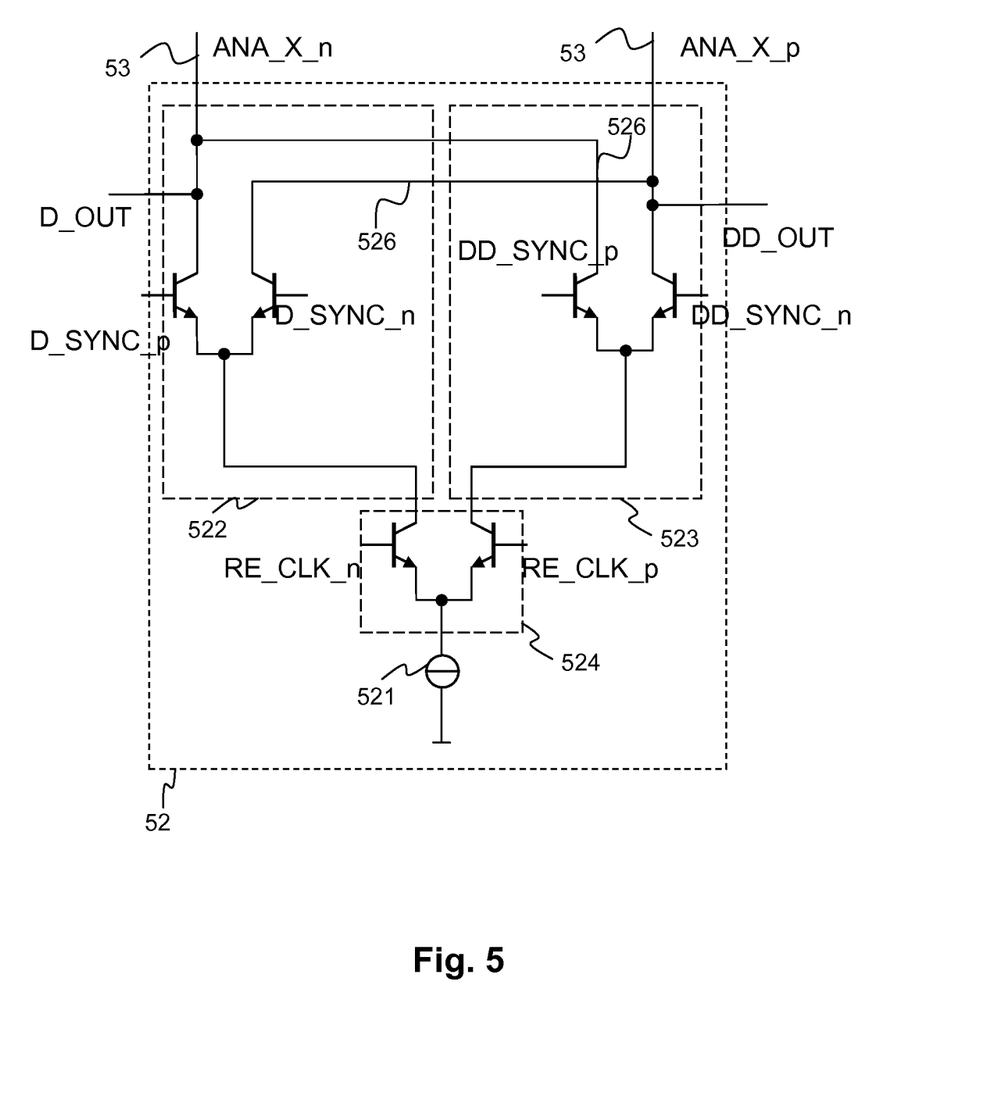
FIG. 5 shows a first exemplary embodiment of an analog output switching unit contained in an analog output cell of a DAC according to the invention.

In FIG. 5, a first exemplary embodiment of an analog output switching unit 52 in an analog output cell 5 of a DAC_1 according to the invention is shown. Therein, the analog output switching unit 52 comprises a current source 521 which is connected in series to a retiming switch 524 (shown in dotted lines). At the output of the retiming switch 524 a first switching element 522 and a second switching element 523 (both shown in dotted lines) are connected in parallel using their respective first nodes. The second node of the first switching element 522 is connected to the analog cell output 53. The second node of the second switching element 523 is also connected to the analog cell output 53. Furthermore, the respective second node of the first switching element 522 is connected to the second node of the second switching element 523. Additionally, the second node of the second switching element 523 is also connected to the second node of the first switching element 522. This is shown with the crossed connection 526. By combining the RZ-signals D_OUT and DD_OUT of the respective switching elements 522, 523 with the crossed connections 526, a local interleaving instead of a global interleaving of the RZ-signals D_OUT and DD_OUT is achieved and the output signal ANA_X is a NRZ-signal.

As shown in FIG. 5, the analog output switching unit 52 is build with complementary components. Thus, the first switching element 522, the second switching element 523 and the retiming switch 524 are each built with a pair of complementary transistors, wherein at each transistor's control node, a respective complementary part of the respective signal RE_CLK_n, RE_CLK_p, D_SYNC_n, D_SYNC_p, DD_SYNC_p and DD_SYNC_n is provided. Thus, the analog cell output 53 comprises a complementary output signal ANA_X_n, ANA_X_p. The use of complementary components and complementary signals to drive the analog output switching unit 52 leads to a reduction of a memory effect in the analog output switching unit 52, which is especially important for high data rates and high dynamic ranges of the DAC_1.

The retiming switch 524 is continuously switched. The continuous switching activity of the retiming switch 524 allows a toggling of the signals and thus avoids long periods in which the output does not change its voltage value. Thus, distortion related to switching is moved to a clock harmonic instead of a data related harmonic.

The circuitry according to FIG. 5 provides a topology which splits the clock load into two separate loads wherein the RE_CLK is different to the DIG_CLK. This leads to separate clock loads which reduces phase noise and power consumption on the final critical clock driver. Generating the low phase noise clock is simplified when the load of the clock driver is smaller with reduced capacitances. Reducing the size of load, the clock driver enables a design with sharper clock edges and reduces problems related to thermal gradients, and enables better DAC phase noise results. Since the final retiming is obtained in the analog output switching unit 52, a retiming in the final analog circuit is given which leads to the best possible phase noise performance compared to all other possible DAC topologies.

Figure 6:
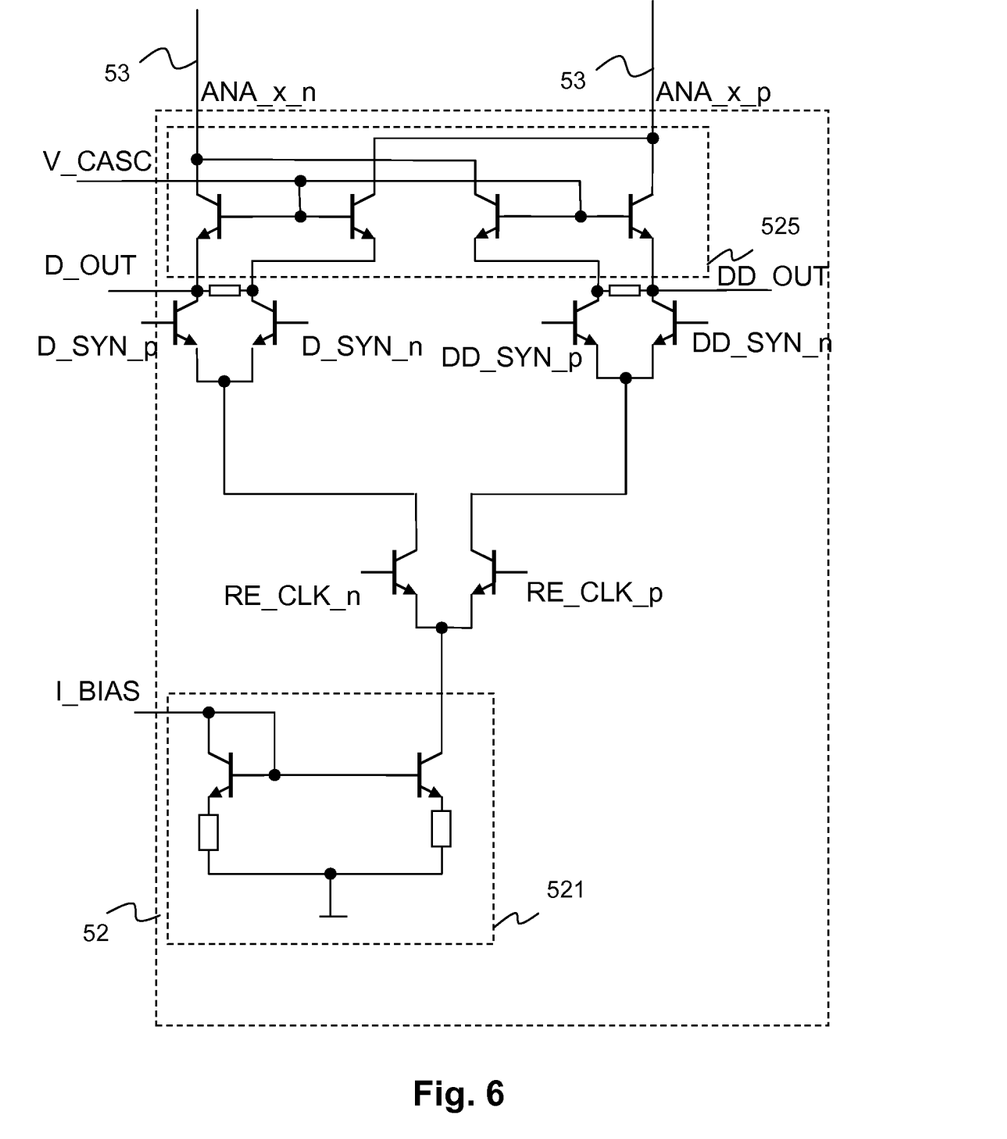
FIG. 6 shows a second exemplary embodiment of an analog output switching unit of an analog output cell in a DAC according to the invention.

In FIG. 6, a second exemplary embodiment of an analog output switching unit 52 of an analog output cell 5 in a DAC_1 according to the invention is shown. In comparison to FIG. 5, in FIG. 6 the current source 521 is shown in greater details and built as a current mirror that is biased with a bias current I_BIAS. The analog cell output 53 is driven by a voltage cascade 525 that is a self-biased cascade. A cascade voltage V_CASC is provided to each output cascade part in order to drive the analog cell output 53.

Figure 7:
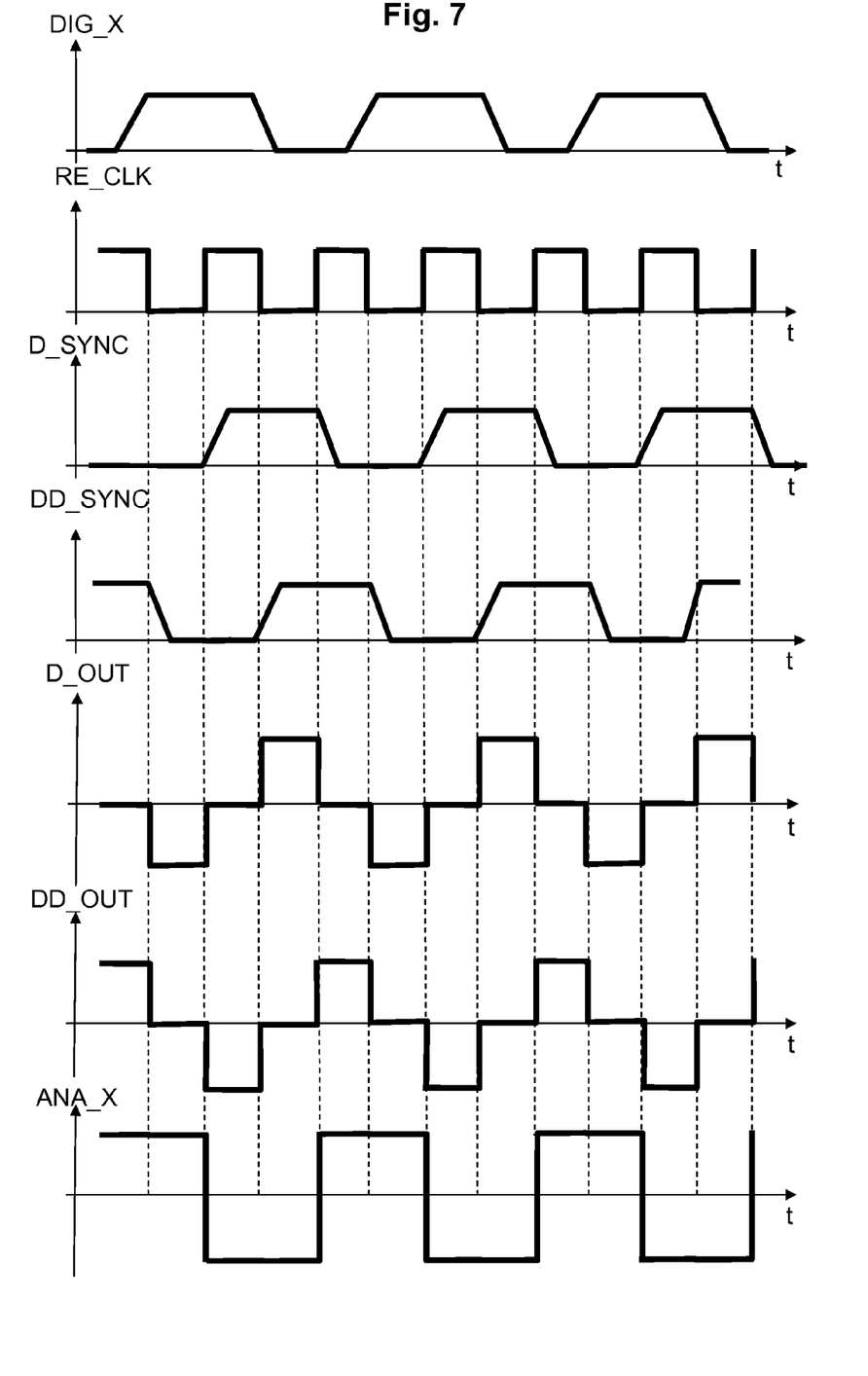
FIG. 7 shows exemplary timing signal-diagrams of various signals in an analog output switching unit according to the invention operated in an NRZ mode.

In FIG. 7, exemplary timing signals used in the analog output cell 5 operating in a NRZ-mode are shown as signal-diagrams. In FIG. 7, the encoded digital input signal DIG_X, the retiming signal RE_CLK, the first clock synchronized digital data signal D_SYNC, the second clock synchronized digital data signal DD_SYNC, the second node output voltage D_OUT of the first switching element 522, the second node voltage DD_OUT of the second switching element 523 and the respective partial analog output signal ANA_X are shown in time-related manner.

The digital input signal DIG_X is time-aligned to the retiming signal RE_CLK in that the rising edge of the retiming signal RE_CLK switches the first clock synchronized digital data signal D_SYNC and the falling edge of the retiming signal RE_CLK switches the second clock synchronized digital data signal DD_SYNC. D_SYNC and DD_YNC are both RZ-signals that reduce the inter-symbol-interference. Since a continuous switching activity independent of the data patterns is obtained in the analog output switching unit 52, the clock is toggled back and forth between sides of the circuit as is shown with the signals D_OUT and DD_OUT. A combination of the two distinct RZ-signals D_SNYC and DD_SYNC using the crossed connection 526 of the switching elements 522, 523 a partial analog output signal ANA_X is obtained that is a NRZ-signal. Thus, no reduction of half output RF power is obtained and low phase noise by eliminating the inter-symbol interferences is still achieved.

Figure 8:
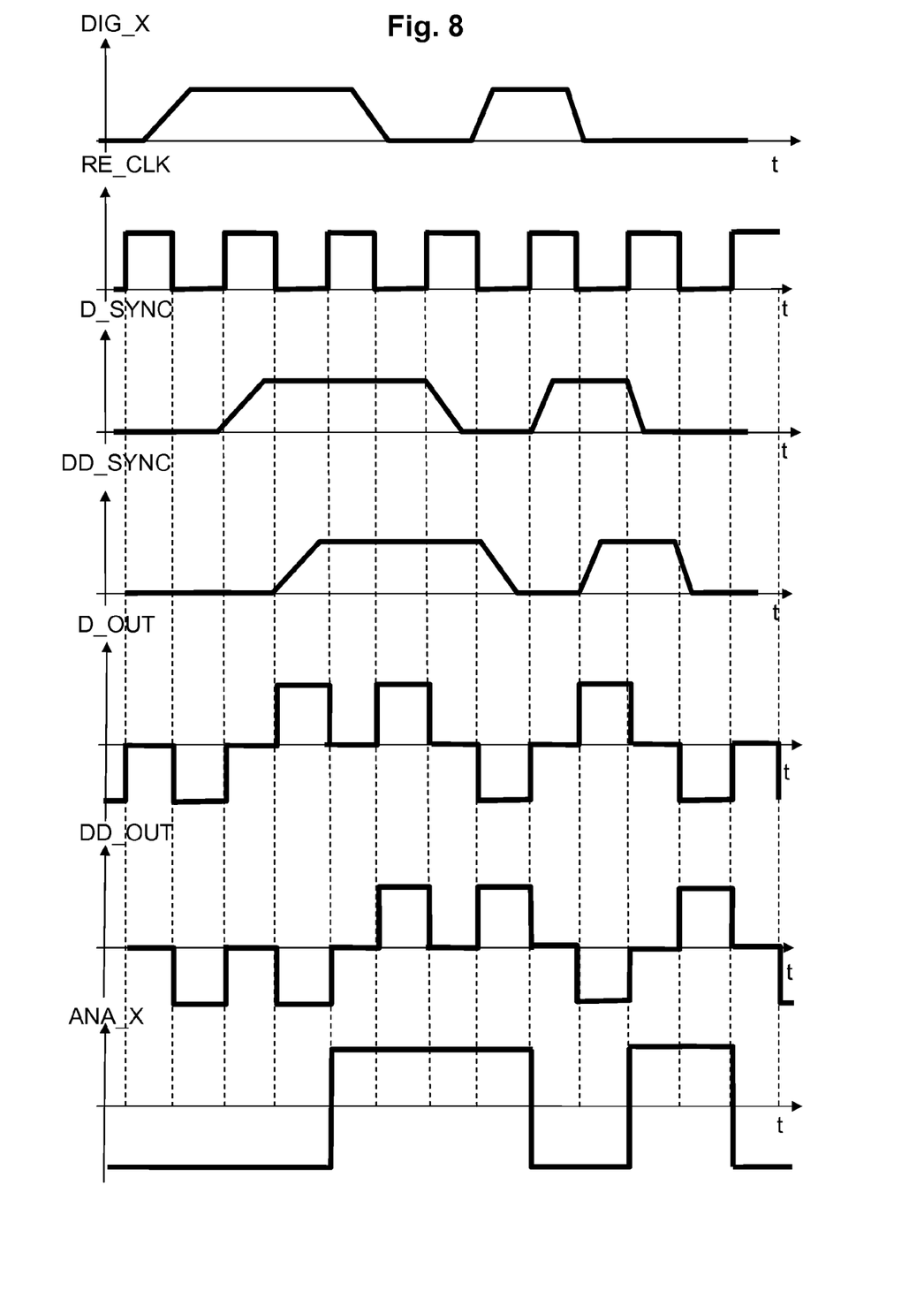
FIG. 8 shows exemplary timing signal-diagrams of various signals in an analog output switching unit according to the invention operated in a mixed-mode.

Referring to FIG. 8, a mixed mode operating analog output cell 5 is shown instead of the NRZ-mode operation according to FIG. 7. Also in FIG. 8, the encoded digital input signal DIG_X, the retiming signal RE_CLK, the first clock synchronized digital data signal D_SYNC, the second clock synchronized digital data signal DD_SYNC, the second node output voltage D_OUT of the first switching element 522, the second node voltage DD_OUT of the second switching element 523 and the respective partial analog output signal ANA_X are shown in time-related manner.

The first clock synchronized digital data signal D_SYNC and the second clock synchronized digital data signal DD_SYNC are phase inverted. The phase inversion leads to a mixed-mode analog output signal with more RF output power when using the DAC in second and third Nyquist frequency bands.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalences.

Although the invention has been illustrated and described with respect to one or more implementations, equivalent alterations and modifications will occur to those skilled in the art upon the reading and the understanding of the specification and the annexed drawings. In addition, while a particular feature of the invention may have been disclosed with respect to only one of the several implementations, such feature may be combined with one or more other feature of the other implementations as may be desired and advantage for any given or particular application.

What is claimed is:

1. A digital-to-analog converter that comprises:
at least one analog output cell configured to selectively generate a partial analog non-return-to-zero, NRZ, signal in response to a digital input signal, wherein the analog output cell comprises:
an analog output switching unit that comprises:
a current source connected in series to a first node of a retiming switch; and
a first switching element and a second switching element, both connected with respective first nodes in parallel to a second node of the retiming switch; wherein a second node of the first switching element is cross-connected to a second node of the second switching element to combine two distinct return-to-zero, RZ, signals to the NRZ signal; and
a switching logic configured to regulate a transmission of said partial analog signal to an analog cell output.

2. The converter according to claim 1, wherein the retiming switch is driven by a retiming clock signal different to the data clock signal.

3. The converter according to claim 1, wherein the switching logic provides a first clock synchronized digital data signal and a second synchronized digital data signal to the analog output switching unit to regulate the transmission of said partial analog signal.

4. The converter according to claim 3, wherein the first clock synchronized digital data signal is phase inverted to the second clock synchronized digital data signal by means of a phase inverter.

5. The converter according to claim 4, wherein the phase inverter is enabled by a mode selection signal.

6. The converter according to claim 1, wherein the analog output cell is built to receive and process complementary signals.

7. The converter according to claim 1, wherein the analog output switching unit further comprises a transistor output cascade.

8. The according to claim 7, wherein the output cascade is self-biased.

9. The converter according to claim 1, wherein the retiming switch is driven by a retiming clock signal that is continuously switched independent on the digital input signal.

10. The converter according to claim 1, wherein the analog cell output is connected to a summing unit arranged downstream to the analog output cell.

11. A digital-to-analog converter that comprises a plurality of analog output cells according to claim 1, wherein each analog output cell is configured to selectively generate a partial analog non-return-to-zero, NRZ, signal in response to a return-to-zero, RZ, digital input signal, wherein the analog output signals are equivalent to each other, wherein each analog output cells output is provided to a summing unit, said summing unit is configured to combine each partial analog NRZ signal to produce the analog output.

12. The converter according to claim 11, wherein all partial analog signals are combined simultaneously due to the same retiming clock provided to all analog output cells.

13. The converter according to claim 11, wherein the partial output signals are binary scaled.

14. A digital-to-analog conversion method, comprising:
receiving a digital return-to-zero, RZ, input signal;
generating equivalent partial analog non-return-to-zero, NRZ, signals in response to said digital RZ input signals with an analog output cell according to claim 1, wherein said equivalent partial analog NRZ signals are equivalent to each other;
regulating transmission of said equivalent partial analog NRZ signals; and
receiving and combining said equivalent partial analog NRZ signals to produce an analog output, said analog output being an analog representation of said digital RZ input signal.

* * * * *